United States Patent
Bernardon

(10) Patent No.: US 8,941,404 B2
(45) Date of Patent: Jan. 27, 2015

(54) SYSTEM AND METHOD FOR TESTING A POWER SUPPLY CONTROLLER

(75) Inventor: Derek Bernardon, Villach (AT)

(73) Assignee: Infineon Technologies Austria AG, Villach (AT)

( * ) Notice: Subject to any disclaimer, the term of this patent is extended or adjusted under 35 U.S.C. 154(b) by 626 days.

(21) Appl. No.: 13/306,909

(22) Filed: Nov. 29, 2011

(65) Prior Publication Data

US 2013/0134985 A1 May 30, 2013

(51) Int. Cl.
 *G01R 31/40* (2014.01)
 *G01R 31/3187* (2006.01)
 *G01R 31/02* (2006.01)
 *G01R 31/28* (2006.01)

(52) U.S. Cl.
 CPC .............. *G01R 31/40* (2013.01); *G01R 31/025* (2013.01); *G01R 31/2856* (2013.01); *G01R 31/3187* (2013.01)
 USPC .............. 324/764.01; 324/750.3; 324/762.01; 324/537

(58) Field of Classification Search
 CPC .... G01R 31/02; G01R 31/021; G01R 31/022; G01R 31/024; G01R 31/025; G01R 31/026; G01R 31/04; G01R 31/041; G01R 31/2812; G01R 31/282; G01R 31/2856; G01R 31/3004; G01R 31/3012; G01R 31/31721; G01R 31/31724; G01R 31/3187; G01R 31/40; G01R 31/42
 USPC ......... 324/527, 512, 500, 537, 750.3, 764.01, 324/762.01
 See application file for complete search history.

(56) References Cited

U.S. PATENT DOCUMENTS

| | | | | |
|---|---|---|---|---|
| 5,966,021 A | * | 10/1999 | Eliashberg et al. | 324/750.05 |
| 6,127,837 A | * | 10/2000 | Yamamoto et al. | 324/750.05 |
| 6,675,322 B1 | * | 1/2004 | Schaffroth et al. | 714/25 |
| 7,924,542 B2 | | 4/2011 | Takahashi et al. | |
| 8,106,640 B2 | | 1/2012 | Itakura | |
| 2005/0083715 A1 | | 4/2005 | Guillarme et al. | |
| 2005/0270034 A1 | * | 12/2005 | Tsuchiya | 324/509 |
| 2007/0153439 A1 | | 7/2007 | Matyas | |
| 2010/0204946 A1 | * | 8/2010 | Warren et al. | 702/108 |
| 2012/0013356 A1 | * | 1/2012 | Eckert et al. | 324/750.3 |

FOREIGN PATENT DOCUMENTS

| | | |
|---|---|---|
| CN | 101189795 A | 5/2008 |
| CN | 102160271 A | 8/2011 |
| EP | 0852354 A1 | 11/1997 |
| EP | 0974848 A2 | 1/2000 |

* cited by examiner

Primary Examiner — Hoai-An D Nguyen

(74) Attorney, Agent, or Firm — Slater & Matsil, L.L.P.

(57) ABSTRACT

In accordance with an embodiment, a method of testing a power supply controller includes detecting whether an external switch is coupled between a first supply pin and the second supply pin. If the external switch is detected, the method determines whether there is a short circuit between the second supply pin and the switching output pin. If the short circuit between the second supply pin and the switching output pin is not detected, however, the method determines whether there is a short circuit between a switch control pin and the second supply pin. If the short circuit between the switch control pin and the second supply pin is not detected, the method determines whether there is a conductive path between the first supply pin and the second supply pin when the switch control pin activates the external switch.

24 Claims, 5 Drawing Sheets

SYSTEM AND METHOD FOR TESTING A POWER SUPPLY CONTROLLER

TECHNICAL FIELD

This invention relates generally to semiconductor circuits and methods, and more particularly to a system and method for testing a power supply controller.

BACKGROUND

Airbag supplemental restraint systems (SRS) have become increasingly pervasive because of their ability to protect vehicle occupants from serious injury in the event of a collision. A typical airbag system has an airbag, an inflation device, and a crash sensor that detects a sudden deceleration of the vehicle. In order to prevent accidental or unwanted airbag inflation, airbag systems generally require a high safety integrity level to prevent accidental or unwanted airbag inflation. One way to maintain a high safety integrity level is to use multiple sensors. For example, a typical side impact airbag system has a pressure sensor inside a car door, and an accelerometer located in a pillar next to the car door. If the pressure sensor measures a sudden rise in pressure at the same time the accelerometer detects an acceleration, the SRS system deploys the side impact airbag. By setting proper timing and amplitude conditions for the pressure sensor and accelerometer, the airbag is deployed in the event of a collision, but not from a vibration caused by a person closing the door, for example. Generally, the requisite sensing and triggering of the airbag system is coordinated by a microcontroller or microprocessor coupled to various elements of the SRS system.

One issue related to the safety integrity of SRS is the electrical integrity of the circuits and circuit boards that are coupled to the SRS system. This integrity is maintained, not only to the microcontroller and components of the SRS system, but also to the power supply system that provides power to the microcontroller and other elements of the SRS system.

For example, if there is a short circuit on a circuit board or other piece of electronic equipment that is associated with the SRS system, there is a possibility that the airbag may deploy under certain conditions. One such condition is a pin short circuit in a power supply that supplies power to the microcontroller. Such a short circuit may cause the voltage of a microcontroller of an airbag module to rise to levels that may cause physical damage to the electronic components and potentially trigger an inadvertent airbag deployment. Some automotive functional safety requirements, such as ASEAL-D ISO26262 require electronic circuits associated with automated of safety systems, such as microcontrollers, be protected in order to prevent such an accidental airbag deployment.

SUMMARY OF THE INVENTION

In accordance with an embodiment, a method of testing a power supply controller includes detecting whether an external switch is coupled between a first supply pin and the second supply pin. If the external switch is detected, the method determines whether there is a short circuit between the second supply pin and the switching output pin. If the short circuit between the second supply pin and the switching output pin is not detected, however, the method determines whether there is a short circuit between a switch control pin and the second supply pin. If the short circuit between the switch control pin and the second supply pin is not detected, the method determines whether there is a conductive path between the first supply pin and the second supply pin when the switch control pin activates the external switch.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a power supply controller circuit having a built-in test (BIST) circuit that detects circuit board conditions that may result in a system failure. The invention may also be applied to detect short circuits and other failure conditions in other types of circuits and systems.

According to an embodiment of the present invention, a built-in self-test system (BIST) for a power supply controller that determines whether there is an external protection switch coupled between a high voltage power supply and a power input to a switched-mode buck converter. If an external protection switch is detected, the BIST system further determines whether there are short circuits on the pins of the power supply controller that could cause the voltage of a microcontroller to rise to a dangerous level in an unsafe manner. If such a condition is detected, the BIST system then disables the switch for the ignition cycle, otherwise the power supply system is allowed to operate.

Embodiments of the present invention may be directed toward automotive safety systems, for example airbag systems. It should be appreciated, however, that embodiment principles may be applied toward other types of systems, such as switch mode power supply systems. Embodiments of the present invention may also be applied to other types of testing systems. For example embodiments may be directed toward in-situ system testing of integrated circuits within its target system.

Figure 1A:
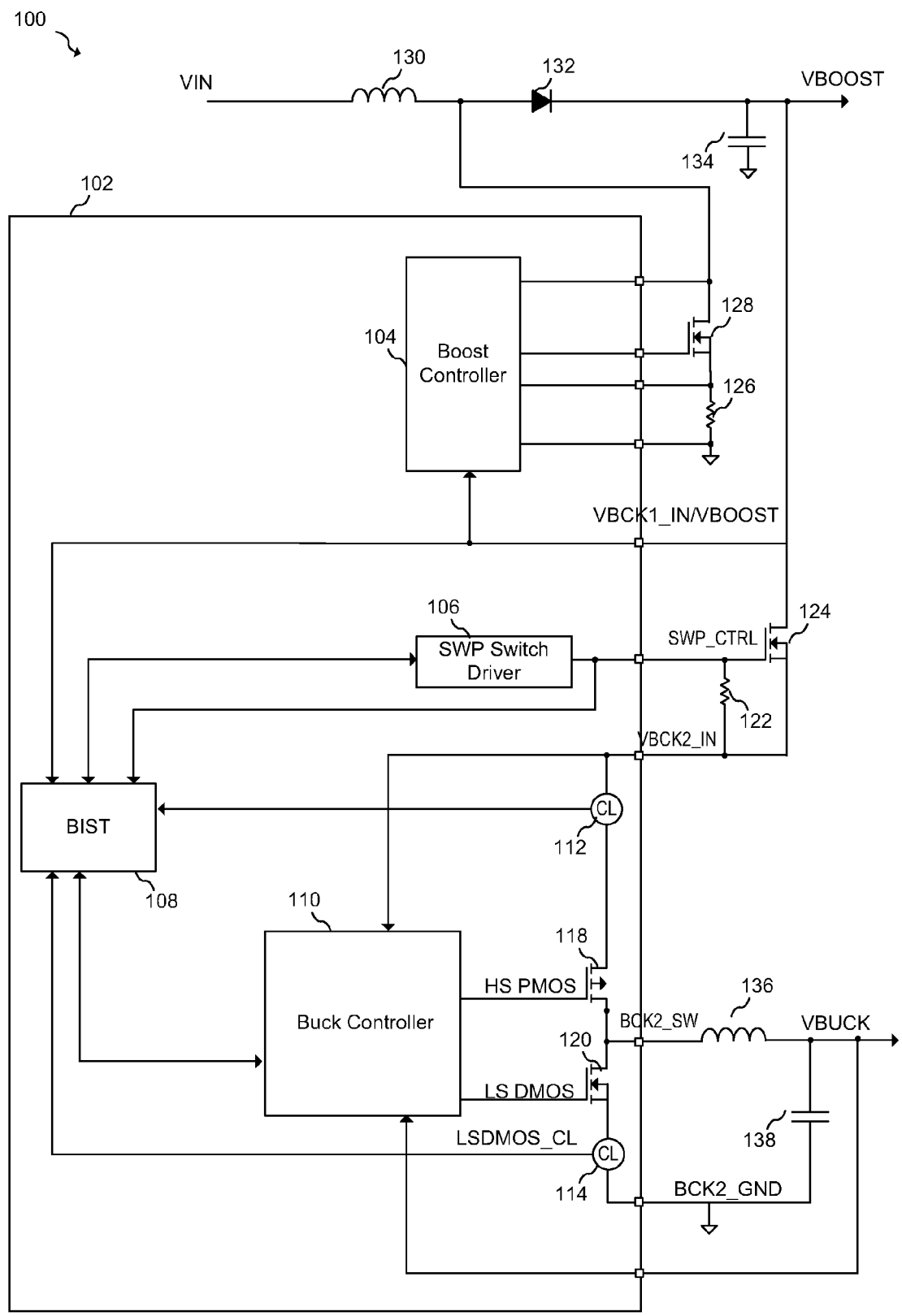
FIGS. 1a-b illustrates power supply systems according to an embodiment of the present invention.

FIG. 1a illustrates power supply system 100 according to an embodiment of the present invention. Power supply system 100 has a power supply controller integrated circuit (IC) and a variety of external components. Integrated circuit 102 has boost controller 104 that controls a boosting switch mode power supply. Boost controller 104 is coupled to switching transistor 128 and sensing resistor 126. Switching transistor 126 is coupled to inductor 130, rectifying diode 132 and output filtering capacitor 134. In an embodiment, the boost converter converts voltage VIN to voltage VBOOST. In some embodiments, the voltage at output node VBOOST may be greater than the voltage at VIN. In other environments, the voltage at VBOOST may be less than the voltage at node VIN. In yet further embodiments the voltage at node VBOOST may be supplied externally by another source. It should be further appreciated that the topology of the external components coupled to boost converter 104 may be different. In alternative embodiments, various component arrangements may be used according to power supply topologies known in the art.

IC 102 also has buck controller 110 that controls a second switch mode power supply. In the system illustrated in FIG. 1a, the second power supply is a buck converter. Buck controller 110 is coupled to high side PMOS device 118 and low side n-channel PMOS device 120. The drains of transistors 118 and 120 are coupled to pin BCK2_MSW, which is coupled to inductor 136 and output filtering capacitor 138. Output voltage VBUCK is fed back to buck controller 110 such that buck converter 110 regulates voltage VBUCK using feedback techniques the known in the art. Current limiters 112 and 114 limit the current supplied to the buck converter to protect IC 102 as well as to provide an input to built in self test block 108. In some embodiments of the present invention, output voltage VBUCK is used to power a microcontroller that is used in an airbag module.

In an embodiment of the present invention, the voltage produced at VBOOST is used as an input to the buck converter. In one embodiment, external switching transistor 124 is placed in series between VBOOST and VBCK2_IN in order to provide protection to the buck converter. This external switching transistor 124 may be used to protect a microcontroller or other types of circuitry that is coupled to VBUCK from overvoltage conditions. In one embodiment, external switching transistor 124 is activated by switch driver block 106. In the case of a sense overvoltage condition on tenant VBCK2_IN, switch driver 106 may be used to disable switching transistor 124. Furthermore, switch transistor 124 may be placed in an off state when IC 102 is being powered up or the system in which IC 102 resides being powered up.

In an embodiment, BIST block 108 is used to verify the existence of switching transistor 124 as well as making sure certain input pins are not shorted together. In particular BIST block 108 may determine whether tends SWP_CTRL and VBCK2_IN are shorted together, or if pins VBCK2_IN and BCK2_SW are shorted together. If, for example, it is determined that pins VBUCK2_IN and BCK2_SW are shorted together, the buck converter is shut down during operation in order to prevent an overvoltage condition on the buck that may damage circuitry coupled to VBUCK such as a microcontroller used to deploy an automotive airbag. In some embodiments, resistor 122 is coupled between the gate and source of transistor 122 in order to discharge the gate capacitance of the transistor 128 thus turning it OFF, such that that in case of an open pin at SWP_CTRL, transistor 128 does not turn ON.

Figure 1B:
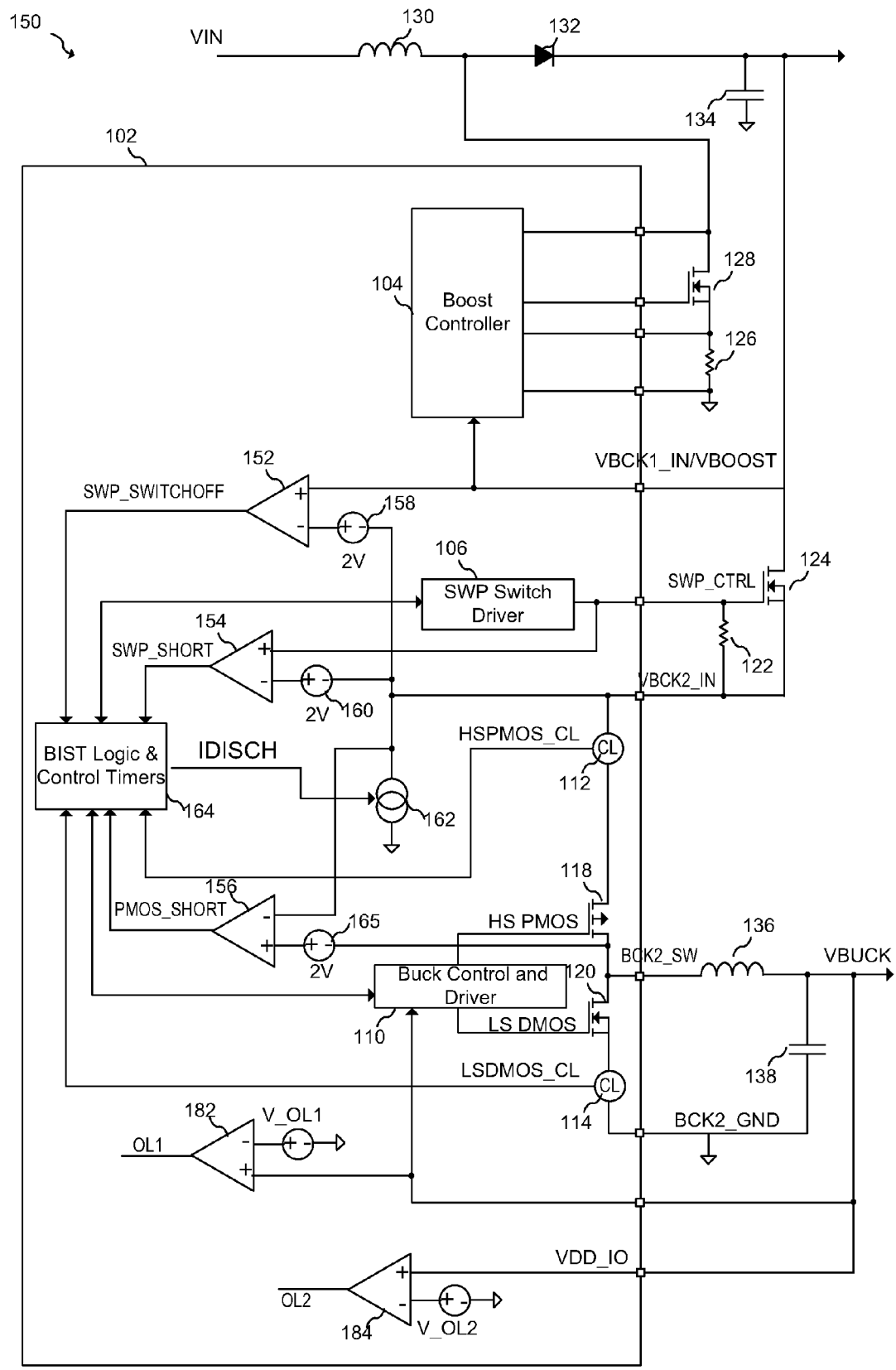

Turning to FIG. 1b power supply system 150 is illustrated in which more of the details of BIST block 108 are illustrated. Switchable current source 162 is coupled to buck converter supply pin VBCK2_IN, and is controlled by BIST logic and control timer block 164 via signal IDISCH. Switchable current source 162 is used during test to discharge node VBUCK2_IN in various test situations. Comparator 152 is used to compare the voltage difference between nodes VBCK1_IN and VBCK2_IN with threshold voltage 158, comparator 154 is used to compare the voltage difference between nodes SWP_CTRL with threshold voltage 160, and comparator 156 is used to compare the voltage difference between nodes VBCK2_IN and BCK2_SW with threshold voltage 165. In the embodiment shown in FIG. 1b, threshold voltage 158, 160 and 165 are all set to be 2 V. In alternative embodiments of the present invention, threshold voltages 158, 160, and 165 may be set to different voltages depending on the system and its specifications.

In one embodiment, the output of comparator 152 and the output of comparator 154 and the output of comparator 156 are input into BIST logic and control timer block 164. The output of these comparators is used to determine whether there is a short circuit on the various pins of which these comparators are connected. Signal SWP_SWITCHOFF at the output of comparator 152 may be used by BIST logic and control verify that there is a potential difference between nodes VBCK1_IN and VBCK2_IN, signal SWP_SHORT of comparator 154 may be used to control to determine whether there is a short between switch driver output pin SWP_CTRL and buck converter power supply pin VBCK2_IN, and comparator 156 may be used to determine whether there is a short circuit between VBCK2_IN and BCK2_SW. A short circuit between VBCK2_IN and BCK2_SW may also be determined by polling current limiting blocks 112 and 114 in series with the buck converter switching transistors 118 and 114.

In some embodiments, buck converter output transistors 118 and 120 may be controlled to help determine whether or not there are various short-circuits among the pins of IC 102. For example, in some embodiments, transistor 120 is turned on such that there is an external path between pin VBCK2_SW and ground, and PMOS transistor 118 is shut off. This comparator 156 senses whether the potential difference between pins VBCK2_IN and BCK2_SW is less than a threshold, for example 2V. IF so, BIST logic and control timer block 164 may determine that PMOS 118 is short-circuited.

Figure 2A:
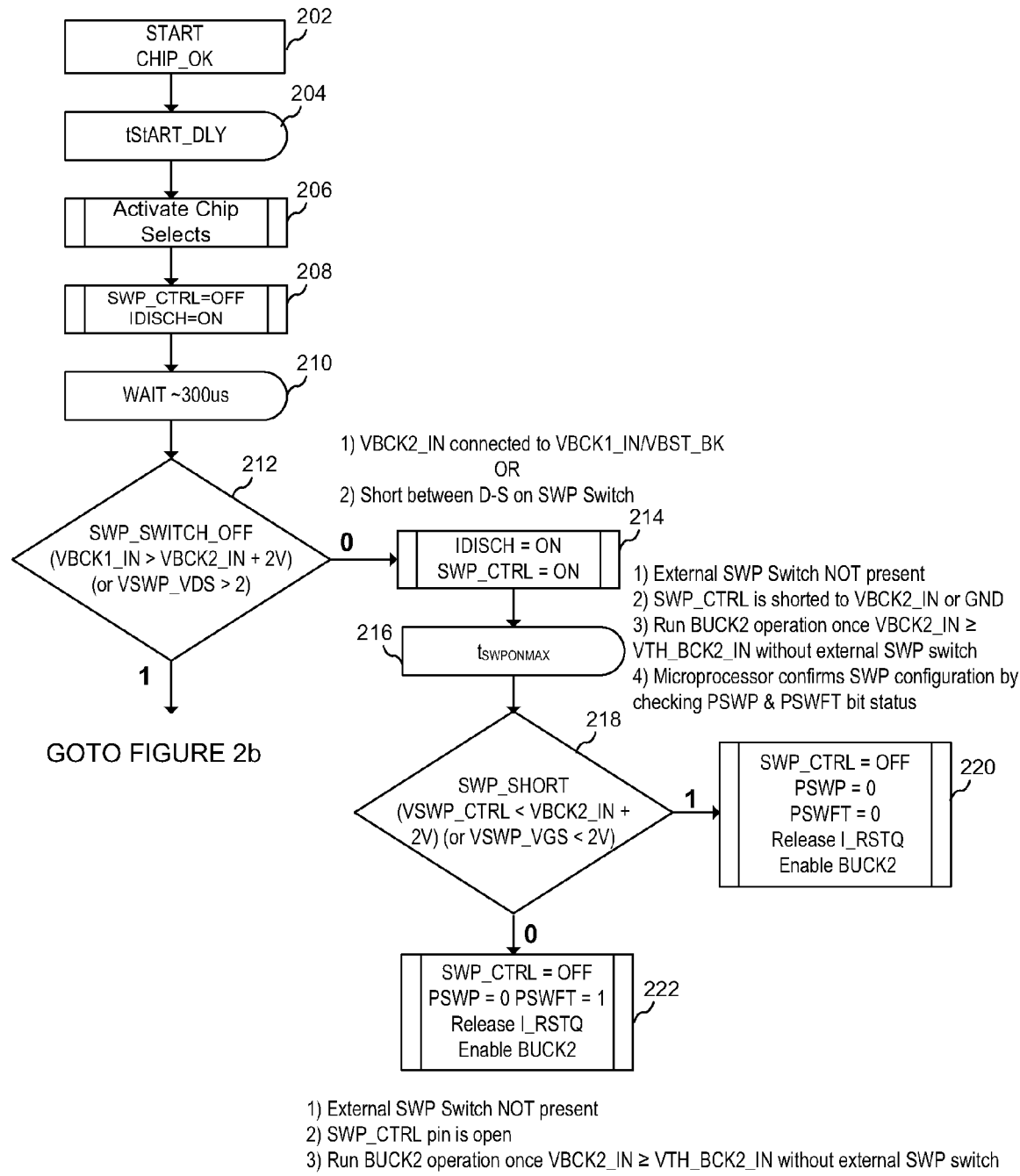
FIGS. 2a-b illustrate a flowchart of an embodiment method.
Figure 2B:
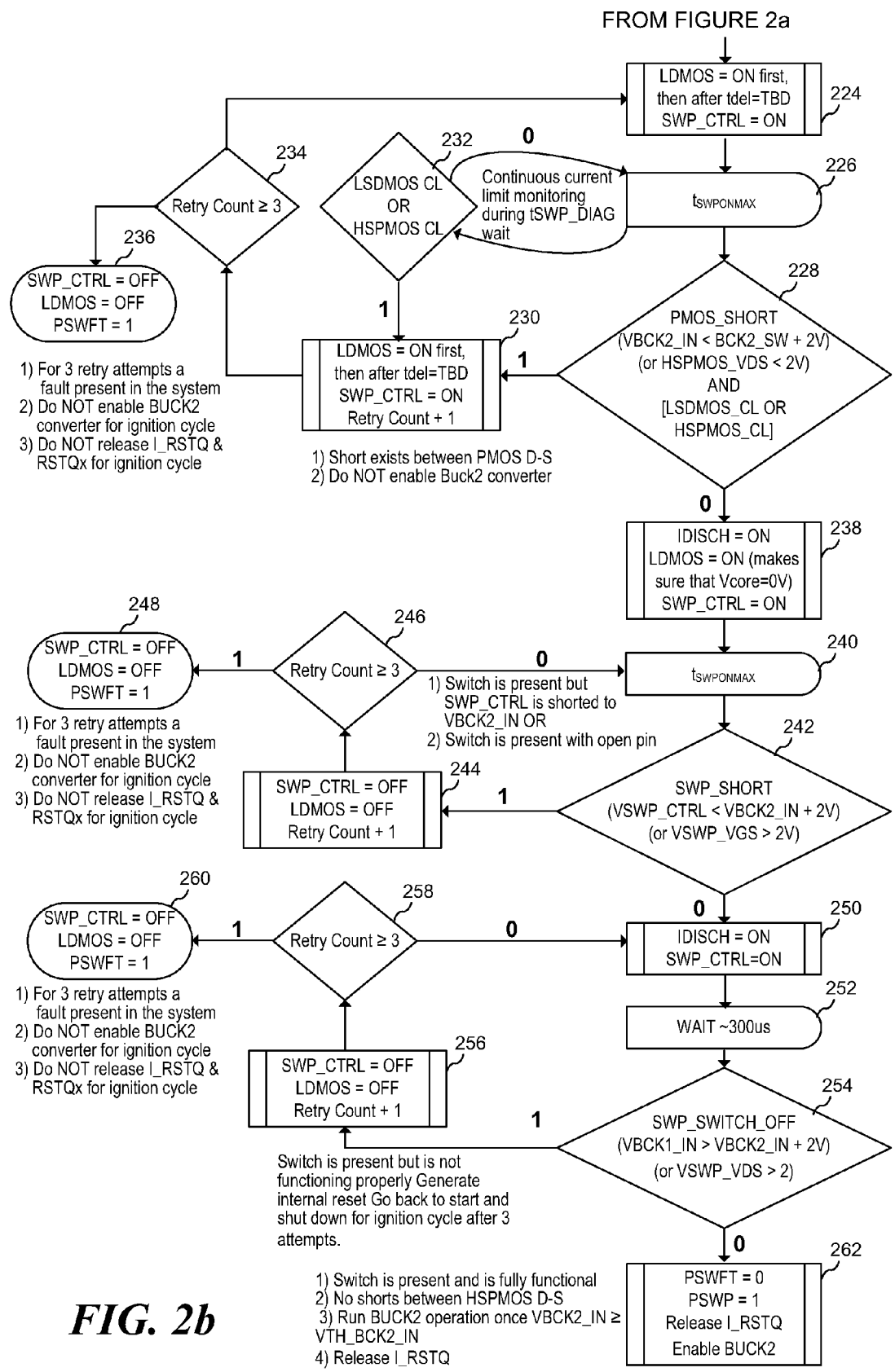

FIGS. 2a and 2b illustrate a flowchart of an embodiment method. Turning to FIG. 2a, the method starts at step 202, in which the chip is powered on and certain chip diagnostic procedures are performed. In step 204, the method pauses for a time duration $t_{START\_DLY}$, which in some embodiments is between about 1 ms and about 5 ms, however in alternative embodiments different delay times may be used. In step 206, the embodiment power supply integrated circuit is selected for activation. Such activation steps in may include the assertion of chip select pins, the writing of registers, or other methods known in the art to initiate functionality within the integrated circuit. In step 208 control signal SWP_CTRL, which is configured to be coupled to an external switch, is de-asserted. If the external switch is connected, de-asserting SWP_CTRL will turn off the external switch. Also, in step 208, current source 162 (see FIG. 1b) is activated, thereby discharging a node configured to be coupled to one of the terminals of the external switch. Next, in step 210 the method is paused for approximately 300 µs. Alternatively, a longer or shorter period of time may be used in this pause state, or step 210 may be omitted. This delay gives current source 162 an opportunity to discharge one of the nodes configured to be coupled to the external switch.

In an embodiment steps 212 through 222 are used to determine whether the external switch is present. In step 212, the output of comparator for 152 is polled to determine whether the voltage across two terminals of the external switch is greater than a threshold. In the depicted case, the threshold is set to be about 2 V; however, in alternative embodiments of the present invention other thresholds may be used. If SWP_SWITCHOFF is not asserted, signifying that the voltage across the switch is less than the threshold, the method suspects that a switch is not present. In step 214, the discharge current from current source 162 a shot off and the gates control node is activated. Next, in step 216, the method is delayed for time $t_{SWPONMAX}$. This time is between about 300 μs. In some embodiments of the present invention the purpose of the delay in step 216 is to allow any external capacitance connected to the pin to be discharged.

Next in step 218, the method determines whether there is a short circuit between the gate node of the switch and between the switch output node coupled to the power supply input of the buck converter by polling the output of comparator 154. If signal SWP_SHORT is low, signifying that the voltage between two adjacent pins is less than a threshold, the method assumes that there is a short between the two adjacent pins. If step 218 detects a short circuit between the two adjacent pins, switch control node SWP_CTRL is shut off, variables PSWP and PSWFT are set to zero, IRST_Q is released and the buck converter is enabled in step 220 in some embodiments. In an embodiment, variables PSWP and PSWFT are variables stored in a register that are reported via a digital interface, such as an SPI bus. The state of PSWP indicates whether the SWP switch is present, and the state of PSWFT indicates whether there is a fault. IRST_Q is a reset signal that, when asserted, places all of the power supplies in a non-operational, reset state. If, on the other hand a short circuit is not detected across the two adjacent pins, in step 222 switch control node SWP_CTRL is shut off, variable PSWFT is set to zero, PSWFT is set to one, IRST_Q is released and the buck converter is enabled in some embodiments. In embodiments, a fault is signaled, but the power supply system is still operated, as it may be necessary to enable the safety system, such as an airbag system, despite a possible open pin SWP_CTRL, or a short between the drain and source of transistor 124.

In some embodiments, step 218 may be performed even if the buck converter is enabled regardless of the output of the test in order to determine which of two conditions exist. In one condition, an SWP switch may be coupled to the system, but there is a short between pins VBUCK2_IN and VBCK1_IN/VBOOST, but pin SWP_CTRL is open. In another condition, there may be no SWP switch, but pin SWP_CTRL which would nominally shorted to VBUCK2_IN, is open and thus it is possible for the microcontroller to determine whether there is an open pin here.

On the other hand, if the SWP_SWITCHOFF gives the information that a SWP switch is present, then the state machine moves forward to steps 224 to 238 that determine whether there is a short between the pins VBCK2_IN and VBCK2_SW. In order to verify this, in one embodiment, the low side DMOS (LSDMOS) 120 of the Buck Converter is first turned ON, in order to bring the voltage of the microcontroller down to ground during this part of the test in order to protect it. Then, the SWP_SWITCH signal is turned ON. The current limitation of LSDMOS device 120 is also enabled via current limiters 112 and 114, so that if it is triggered then it will immediately shut down the external switch and LSDMOS device 120. If the current limitation is triggered or if PMOS_SHORT comparator 156 is triggered, this part of the BIST will be repeated three times, in one embodiment. After three consecutive fails, the BIST delivers a FAIL flag, disables the system from starting up, and ensures that the external switch remains in OFF for the whole ignition cycle in automotive embodiments.

Step 212 detects the presence of an external switch by sensing that signal SWP_SWITCH_OFF is asserted and a determination is made whether or not there is a short circuit between pins VBCK2_IN and BCK2_SW (see FIG. 1b) in steps 224 to 236 in FIG. 2b. In step 224 the low side DMOS device 120 is turned on, which creates a current path between pin BCK_GND and pin BCK2_SW. Also, high side PMOS device 118 is shut off. After a certain delay, pin SWP_CTRL is activated, thereby turning on the external switch. After a further delay of $t_{SWPONMAX}$ in step 226, output PMOS_SHORT of comparator 156 is polled in step 228. The further delay of $t_{SWPONMAX}$ in step 226 allows for the output capacitor to discharge after LSDMOS 120 is turned ON. In an embodiment, $t_{SWPONMAX}$ is about 370 μs. Alternatively, other delay values may be used. In addition, current limiting sensing blocks 112 and 114 are polled to determine whether or not there is a short circuit current flowing from pin VBCK2_IN to BCK2_GND in step 232.

If a short is suspected between pins VBCK2_IN and BCK2_SW via the state of PMOS_SHORT and/or the current limited blocks 112 and 114, control of the method passes to block 230. In step 230 the low side DMOS device is turned on and, after a certain delay, for example, 40 μs, pin SWP_CTRL is activated. Alternatively, other delay values may be used. Control then passes again to step 224. The test for a short circuit between pins VBCK2_IN and BCK2_SW is attempted three times. If this short-circuit is detected for a total of three times control of the method passes to block 236 from block 234. It should be appreciated that in alternative embodiments, the number of times that the test for the short-circuit is performed may be greater or fewer than three. In block 234 pin SWP_CTRL is deactivated, low side LDMOS device is turned off, and signal PSWFT is set to one. The buck converter is subsequently deactivated because of the detected short-circuit between pins VBCK2_IN and BCK2_SW.

If step 228 did not detect a short-circuit between pins VBCK2_IN and BCK2_SW, the method next determines whether there is a short-circuit between pin SWP_CTRL and pin BCK2_SW in steps 238 through 248. In step 238, current source 162 is turned on, LDMOS device 120 is turned on, and the external switch is activated via signal SWP_CTRL. Next, a delay of $t_{SWPONMAX}$ is applied. In step 242, output SWP_SHORT of comparator 154 is polled to determine whether there is a short circuit between pins SWP_CTRL and BCK2_SW. If a short is detected, the external switch and LDMOS device 120 are deactivated, and the retry count is incremented in step 244. Next, in step 246 the retry count is compared to a threshold, for example, three. If the retry count is less than three then control is passed to delay block 240. If, after three times a short is detected between pins SWP_CTRL and BCK2_SW, then the buck converter is not enabled. In block 248 pin SWP_CTRL is deactivated, low side LDMOS device is turned off, and signal PSWFT is set to one. It should be appreciated that in alternative embodiments of the present invention the retry count can be greater or less than three.

If a short-circuit between pins SWP_CTRL and BCK2_SW was not detected in step 242, the method next determines whether or not the external switch forms a conductive path between pin VBCK1_IN/VBOOST and pin BCK2_IN (see FIG. 1b) is in steps 250 through 262. In step 250, current source 162 is activated and the external switch is activated via SWP_CTL and the method waits for a period of time in step 252 to allow pin BCK2_IN to rise in voltage to the potential on pin VBCK1_IN/VBOOST. In one embodiment, step 252 imposes a wait time of about 300 μs, however, in alternative embodiments of the present invention the method may wait for a longer or shorter time. In step 254, output SWP_SWITCH_OFF is polled to determine whether or not the voltage across pins VBCK1_IN/VBOOST and pin BCK2_IN is greater than a threshold. If SWP_SWITCH_OFF indicates that the voltage across pins VBCK1_IN/VBOOST and pin BCK2_IN is greater than a threshold, then the external switch and LDMOS device 120 are deactivated, and the retry count is incremented in step 256.

In an embodiment, when LDMOS 120 is turned ON, the current is being monitored. At the same time PMOS_SHORT comparator 156 is being monitored as well. In some embodiments, the system waits for a certain time in order that possible discharging doesn't cause a false trigger of the PMOS_SHORT comparator. In the meantime, LSDMOS current limiting circuit 114 is always monitoring the current. As soon as this is triggered both SWP_SWITCH and LSDMOS 120 are turned OFF. This is then reattempted three times. If there is a short, however, the PMOS short comparator is also triggered.

In step 258 the retry count is compared to a threshold, for example, three. If the retry count is less than three then control is passed to delay block 250. If, after three times the voltage across pins VBCK1_IN/VBOOST and pin BCK2_IN is still greater than the threshold, then the buck converter is not enabled. In block 260 pin SWP_CTRL is deactivated, low side LDMOS device is turned off, and signal PSWFT is set to one. It should be appreciated that in alternative embodiments, the retry count can be greater or less than three. If, on the other hand, the voltage across pins VBCK1_IN/VBOOST and pin BCK2_IN is less than the threshold, indicating that the external switch has a conducive path across its terminals, the buck converter is enabled, PSWFT is set to zero, and PSWP is set to one in step 262.

It should be appreciated that the embodiment method shown in FIGS. 2a and 2b is just one example of an embodiment method. In alternative embodiments, different variables, thresholds, and different delay times may be used, as well as a different order of operation. It should be appreciated that in alternative embodiments, the pin out of the power supply controller integrated circuit may be different from that which is shown in FIGS. 1a and 1b. In such cases, embodiment methods may be used to determine whether or not there are short-circuits and open circuits between various pins.

In an embodiment, the output voltage of the buck converter is constantly monitored with two separate comparators 182 and 184 (see FIG. 1b) on two different pins. The threshold levels of these comparators V_OL1 and V_OL2 may be set above the overvoltage reset level that is also used for clamping the voltage of the buck converter. If, for example, the level of the SWP comparators is reached for a small deglitch filter time, then the cause for such an event may be due to an external short and not to normal operating conditions. In such a case, the external switch may be shut OFF, and an internal reset is performed. In such a case, in some embodiments, only the BIST is repeated after the internal reset time. If this repeated BIST fails, the external switch is turned OFF, and the system is disabled for a whole ignition cycle.

Figure 3:
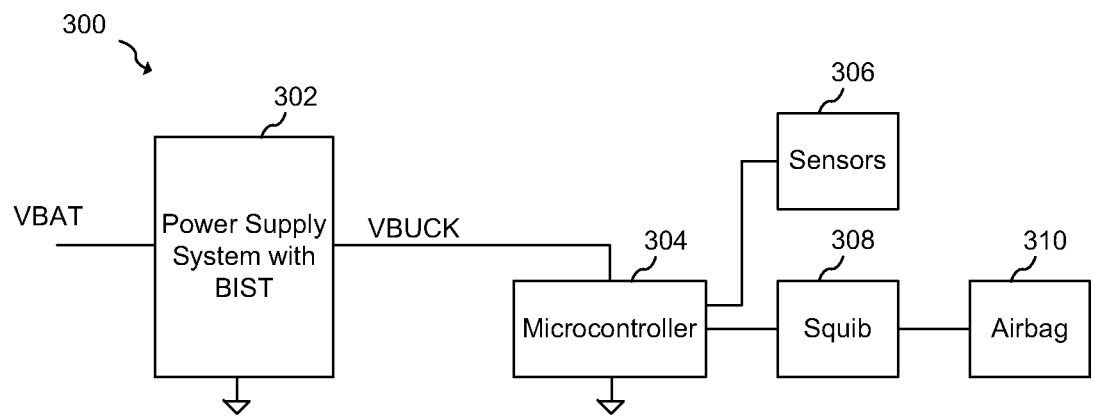
FIG. 3 illustrates an embodiment airbag system.

FIG. 3 illustrates airbag system 300 according to an embodiment of the present invention. Airbag system 300 has power supply system 302 coupled to microcontroller 304. Microcontroller 304 is coupled to sensors 306 and airbag detonation squib 308. Squib 308 is coupled to airbag 310. Microcontroller 304 determines when squib 308 activates airbag 310 based on input from sensors 306. In some embodiments, sensors 306 are located in various portions of the automobile, for example, in the doors or on other parts of the automotive frame. Airbag 310 may be located in various portions of the passenger compartment, for example, in the steering wheel, in the front passenger compartment, in the doors, etc. Power supply 302 converts battery voltage VBAT into voltage VBUCK that is within a suitable operating voltage range for microcontroller 304. In embodiments of the present invention, power supply 302 operates according to the principles described hereinabove. It should be appreciated that the automotive airbag system shown in FIG. 3 is just one example of an application of embodiment power supply systems. Embodiment BIST systems may also be implemented in other types of automotive systems such as safety systems, ignition systems, engine control systems, entertainment systems, etc. Furthermore, embodiment BIST systems may also be used in other non-automotive environments.

In one embodiment, a BIST system determines whether an external protection switch is coupled between a first power supply and an input to a second power supply, as some embodiments, such as low cost embodiments in some circumstances may not implement the external switch. If the BIST does not detect the presence of the external switch, the power supply system is operated. If, however, the BIST determines that the switch is present the BIST system determines whether there is a safe pin short, such that the voltage on the microcontroller does not exceed levels that can cause damage to the system. Once this test is verified, the BIST checks if the control terminal to the switch (such as an external FET) is not shorted, and then also checks that the external switch is turned ON when a turn-on voltage is present. Once all these tests pass, then the external switch is turned ON and the system is initiated.

Once the system is operating, however, there is a possibility that a piece of solder is floating on the PCB board of the system may cause a short circuit short between the two pins of the high side transistor of the Buck Converter. Embodiments of the present invention also include a comparator to detect an excessively high voltage on the microcontroller. After a deglitch filter it will disable the protection switch (SWP switch) to protect the microcontroller.

In accordance with an embodiment, a method of testing a power supply controller includes detecting whether an external switch is coupled between a first supply pin and the second supply pin. If the external switch is detected, the method determines whether there is a short circuit between the second supply pin and the switching output pin. If the short circuit between the second supply pin and the switching output pin is not detected, however, the method determines whether there is a short circuit between a switch control pin and the second supply pin. The switch control pin is configured to be coupled to a control terminal of the switch. If the short circuit between the switch control pin and the second supply pin is not detected, the method determines whether there is a conductive path between the first supply pin and the second supply pin when the switch control pin activates the external switch.

In an embodiment detecting the external switch includes applying a turn-off signal to a switch pin, and applying a measuring current to the second supply pin. After the measuring current is applied, a voltage across the first supply pin and the second supply pin is compared to a first threshold. The method determines that an external switch is detected if the voltage across the first supply pin and the second supply pin is greater than the first threshold In an embodiment, the step of determining whether there is a short circuit between the second supply pin and the switching output pin includes turning on a first switching transistor coupled to the switching output pin, applying a turn-on signal to the switch control pin, and comparing a voltage across the second supply pin and the switching output pin with a second threshold. The method then determines whether there is a short circuit between the second supply pin and the switching output pin by determining whether a voltage across the second supply pin and the switching output pin is less than the second threshold, or if a current limit circuit in series with the first switching transistor detects an overcurrent condition. In some embodiments, the method includes turning off a second switching transistor coupled between the second supply pin and the switching output pin.

In an embodiment, determining whether there is a short circuit between a control terminal of the switch and the second supply pin includes applying a measuring current to the second supply pin and applying a turn-on signal to the switch control pin. After applying the measuring current, a voltage across the switch control pin and the second supply pin is compared to a third threshold. It is determined that there is a short circuit between the switch control pin and the second supply pin if the voltage across the switch control pin and the second supply pin is less than the third threshold. In some embodiments, a first switching transistor coupled to a switching output pin is, further turned on.

In an embodiment, the step of determining whether there is a conductive path between the first supply pin and the second supply pin when the switch control pin activates the external switch includes applying a turn-off signal to a switch pin and applying a measuring current to the second supply pin. After applying the measuring current, a voltage across the first supply pin and the second supply pin is compared to a first threshold. If the voltage across the first supply pin and the second supply pin is less than the first threshold, the method determines that there is a conductive path between the first supply pin and the second supply pin.

In an embodiment, the method further includes operating a switched-mode power supply coupled to the second pin if it is determined that there is a conductive path between the first supply pin and the second supply pin when the switch control pin activates the external switch. In some embodiments, the method includes determining whether there is a short between the control terminal of the external switch and the second supply pin if the external switch is not detected. The method may also include enabling a power supply coupled to the second supply pin if the external switch is not detected.

In an embodiment, the method further includes disabling a power supply coupled to the second supply pin if the external pin is detected and if a short circuit between the second supply pin and the switching output pin is detected, or if a short-circuit is detected between the switch control pin and the second supply pin, or if a conductive path between the first supply pin the second supply pin is not detected when the switch control pin activates the external switch.

In an embodiment, the step of detecting the external switch includes applying a turnoff signal to the switch pin, and applying a measuring current, the second supply pin. After applying the measuring current, a voltage across the first supply pin and the second supply pin is compared to a first threshold. The method determines that the external switch is detected if the voltage across the first supply pin and the second supply pin is greater than the first threshold. Furthermore, the method determines that there is a short circuit between the second supply pin and the switching output pin by turning on a first transistor coupled to the switching output pin and applying a turn-on signal to the switch control pin. A voltage across the second supply pin and the switching output pin is compared with the second threshold. The method determines that there is a short circuit between the second supply pin and the switching output pin. If the voltage across the second supply pin and the switching output pin is less than the second threshold, or if a current limit circuit in series with the first switching transistor detects an over current condition. In an embodiment, the method determines that there is a short circuit between the switch control pin and the second supply pin, by applying the measuring current to the second supply pin and applying a turn-on signal to the switch control pin. After applying the measuring current, a voltage across the switch control pin and the second supply pin is compared to a third threshold. The method determines that there is a short circuit between the switch control pin and the second supply pin if the voltage across the switch control pin and the second supply pin is less than the third threshold. The method then determines whether there is a conductive path between the first supply pin and the second supply pin when the switch control pin activates the external switch by applying the turn-off signal to a switch pin and applying a measuring current to the second supply pin. After applying the measuring current, a voltage across the first supply pin and the second supply pin is compared to a first threshold. If a voltage across the first supply pin and the second supply pin is less than the first threshold, it is determined that there is a conductive path between the first supply pin and the second supply pin.

In accordance with a further embodiment, a method of testing an integrated circuit includes detecting whether an external switch is coupled between a first pin and a second pin. If the external switch is detected, the method determines whether there is a short circuit between the second pin and a third pin. If the short circuit between the second pin and the third pin is not detected, however, the method determines whether there is a short circuit between a fourth pin configured to be coupled to a control terminal of the external switch and the second pin. If, on the other hand, the short circuit between the fourth pin and the second pin is not detected, the method determines whether there is a conductive path between the first pin and the second pin when the fourth pin activates the external switch.

In an embodiment, the step of detecting the external switch includes attempting to turn off the external switch, coupling a current source to the second pin, and comparing a voltage between the first pin and the second pin to a first threshold. If the voltage between the first pin and the second pin is greater than the first threshold, it is determined that the external switch is connected.

In an embodiment, the step of determining whether there is a short circuit between the second pin and the third pin includes turning on a first switching transistor coupled to the third pin, turning on the external switch, and comparing a voltage across the second pin and the third pin with a second threshold. It is determined that there is a short circuit between the second pin and the third pin if the voltage across the second pin and the third pin is less than the second threshold. The method determines whether there is a short circuit between the fourth pin and the second pin by coupling a current source to the second pin, turning on the external switch, and comparing a voltage across the fourth pin and the second pin to a third threshold, after coupling the current source to the second pin. The method determines that there is a short circuit between the fourth pin and the second pin if the voltage across the fourth pin and the second pin is less than the third threshold.

In accordance with a further embodiment, a power supply controller integrated circuit includes a first pin configured to receive a first power supply voltage, a second pin configured to receive a second power supply voltage, a third pin configured to drive a control pin of an external switch coupled between the first pin and the second pin, a fourth pin configured to drive a switched voltage to a switched-mode power converter, and a testing circuit configured to detect whether the external switch is coupled to the first, second and third pins, and whether there is a short circuit between the second pin and the fourth pin, and whether there is a short circuit between the second pin and the third pin.

In an embodiment, the testing circuit includes a switchable current source coupled to the second pin, a first comparator coupled to the first pin and the second pin. The first comparator, is configured to compare a voltage between the first and second pins to a first threshold. The integrated circuit further includes a second comparator coupled to the second pin and the third pin, poor the second comparator is configured to compare a voltage between the second and third pins to a second threshold. A third comparator coupled to the second pin and the fourth pin is configured to compare a voltage between the second and fourth pins to a third threshold. A controller is further coupled to the switchable current source, the first comparator, the second comparator and the third comparator.

In an embodiment, the controller is configured to determine whether the external switch is coupled to the first, second and third pins by switching on the switchable current source, and applying a turn-on voltage to the third pin. The controller determines that the external switch is coupled to the first, second and third pins if the first comparator senses that the voltage between the first pin and the second pin is greater than the first threshold. The controller is further configured to determine whether or not there is a short circuit between the second and third pin by turning on a first switching transistor coupled to the fourth pin and applying a turn-on voltage to the third pin. The controller determines that there is a short circuit between the second pin and the third pin if the second comparator senses that the voltage between the second pin and the third pin is less than the second threshold.

In an embodiment, the controller is further configured to determine whether there is a short circuit between the second pin and the fourth pin by switching on the switchable current source, and applying a turn-on voltage to the third pin. The controller determines that there is a short circuit between the second pin and the fourth pin if the third comparator senses that the voltage between the second pin and the fourth pin is less than the third threshold. In an embodiment, the first, second and third thresholds are about 2 V.

In an embodiment, the controller is further configured to disable a switched-mode power supply coupled to the second pin and the fourth pin if the external switch is detected and if there is a short circuit between the second pin and the fourth pin, or if the external switch is detected and there is a short circuit between the second pin and the third pin. The controller may be further configured to enable a switched-mode power supply coupled to the second pin and the fourth pin if the external switch is not detected.

In an embodiment, the second pin is disposed directly adjacent to the third pin and the third pin is disposed directly adjacent to the fourth pin.

Advantages of embodiments of the present invention that incorporate a built-in self-test includes that once the built-in self-test is performed the external switch is also verified to be functioning correctly. If both parts of the built-in self-test pass, namely the detection of the external switch and the fact that the external switches functioning correctly, the power supply system is allowed to be turned on by enabling the external switch and the switched-mode power supply that is coupled to the nodes being tested.

A further advantage of embodiments includes the determination of the root cause of a problem if there is on.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing a power supply controller, the method comprising:
    detecting if an external switch coupled between a first supply pin and a second supply pin;
    if the external switch is detected, determining if there is a short circuit between the second supply pin and a switching output pin;
    if the short circuit between the second supply pin and the switching output pin is not detected, determining if there is a short circuit between a switch control pin configured to be coupled to a control terminal of the switch and the second supply pin; and
    if the short circuit between the switch control pin and the second supply pin is not detected, determining if there is a conductive path between the first supply pin and the second supply pin when the switch control pin activates the external switch.

2. The method of claim 1, wherein detecting the external switch comprises:
    applying a turn-off signal to a switch pin;
    applying a measuring current to the second supply pin; and
    after applying the measuring current, comparing a voltage across the first supply pin and the second supply pin to a first threshold; and
    determining that the external switch is detected if the voltage across the first supply pin and the second supply pin is greater than the first threshold.

3. The method of claim 1, wherein determining if there is a short circuit between the second supply pin and the switching output pin comprises:
    turning on a first switching transistor coupled to the switching output pin;
    applying a turn-on signal to the switch control pin;
    comparing a voltage across the second supply pin and the switching output pin with a second threshold; and
    determining that there is a short circuit between the second supply pin and the switching output pin comprises determining if the voltage across the second supply pin and the switching output pin is less than the second threshold or if a current limit circuit in series with the first switching transistor detects an overcurrent condition.

4. The method of claim 3, further comprising turning off a second switching transistor coupled between the second supply pin and the switching output pin.

5. The method of claim 1, wherein determining if there is a short circuit between a control terminal of the switch and the second supply pin comprises:
    applying a measuring current to the second supply pin;
    applying a turn-on signal to the switch control pin;
    after applying the measuring current, comparing a voltage across the switch control pin and the second supply pin to a third threshold; and
    determining that there is a short circuit between the switch control pin and the second supply pin if the voltage across the switch control pin and the second supply pin is less than the third threshold.

6. The method of claim 5, further comprising turning on a first switching transistor coupled to a switching output pin.

7. The method of claim 1, wherein determining if there is a conductive path between the first supply pin and the second supply pin when the switch control pin activates the external switch comprises:
    applying a turn-off signal to a switch pin;
    applying a measuring current to the second supply pin; and after applying the measuring current, comparing a voltage across the first supply pin and the second supply pin to a first threshold; and determining that there is a conductive path between the first supply pin and the second supply pin when the voltage across the first supply pin and the second supply pin is less than the first threshold.

8. The method of claim 1, further comprising operating a switched-mode power supply coupled to the second supply pin if it is determined that there is a conductive path between the first supply pin and the second supply pin when the switch control pin activates the external switch.

9. The method of claim 1, further comprising determining if there is short between the control terminal of the external switch and the second supply pin if the external switch is not detected.

10. The method of claim 1, further comprising enabling a power supply coupled to the second supply pin if the external switch is not detected.

11. The method of claim 1, further comprising disabling a power supply coupled to the second supply pin if the external pin is detected and if a short circuit between the second supply pin and the switching output pin is detected, or if a short circuit is detected between the switch control pin and the second supply pin, or if a conductive path between the first supply pin and the second supply pin is not detected when the switch control pin activates the external switch.

12. The method of claim 1, wherein:
detecting the external switch comprises
applying a turn-off signal to a switch pin,
applying a measuring current to the second supply pin,
after applying the measuring current, comparing a voltage across the first supply pin and the second supply pin to a first threshold, and
determining that the external switch is detected if the voltage across the first supply pin and the second supply pin is greater than the first threshold;
determining if there is a short circuit between the second supply pin and the switching output pin comprises
turning on a first switching transistor coupled to the switching output pin,
applying a turn-on signal to the switch control pin,
comparing a voltage across the second supply pin and the switching output pin with a second threshold, and
determining that there is a short circuit between the second supply pin and the switching output pin comprises if the voltage across the second supply pin and the switching output pin is less than the second threshold or if a current limit circuit in series the first switching transistor detects an overcurrent condition;
determining if there is a short circuit between the switch control pin and the second supply pin comprises
applying the measuring current to the second supply pin,
applying a turn-on signal to the switch control pin,
after applying the measuring current, comparing a voltage across the switch control pin and the second supply pin to a third threshold, and
determining that there is a short circuit between the switch control pin and the second supply pin if the voltage across the switch control pin and the second supply pin is less than the third threshold; and
determining if there is a conductive path between the first supply pin and the second supply pin when the switch control pin activates the external switch comprises
applying the turn-off signal to a switch pin,
applying a measuring current to the second supply pin,
after applying the measuring current, comparing a voltage across the first supply pin and the second supply pin to a first threshold, and
determining that there is a conductive path between the first supply pin and the second supply pin when the voltage across the first supply pin and the second supply pin is less than the first threshold.

13. A method of testing an integrated circuit, the method comprising:
detecting if an external switch is coupled between a first pin and a second pin;
if the external switch is detected, determining if there is a short circuit between the second pin and a third pin;
if the short circuit between the second pin and the third pin is not detected, determining if there is a short circuit between a fourth pin configured to be coupled to a control terminal of the external switch and the second pin; and
if the short circuit between the fourth pin and the second pin is not detected, determining if there is a conductive path between the first pin and the second pin when the fourth pin activates the external switch.

14. The method of claim 13, wherein detecting the external switch comprises:
attempting to turn off the external switch;
coupling a current source to the second pin;
comparing a voltage between the first pin and the second pin to a first threshold; and
determining that an external switch is connected if the voltage between the first pin and the second pin is greater than the first threshold.

15. The method of claim 13, wherein:
determining if there is a short circuit between the second pin and the third pin comprises
turning on a first switching transistor coupled to the third pin,
turning on the external switch,
comparing a voltage across the second pin and the third pin with a second threshold, and
determining that there is a short circuit between the second pin and the third pin comprises if the voltage across the second pin and the third pin is less than the second threshold; and
determining if there is a short circuit between the fourth pin and the second pin comprises
coupling a current source to the second pin,
turning on the external switch,
after coupling the current source, comparing a voltage across the fourth pin and the second pin to a third threshold, and
determining that there is a short circuit between the fourth pin and the second pin if the voltage across the fourth pin and the second pin is less than the third threshold.

16. A power supply controller integrated circuit comprising:
a first pin configured to receive a first power supply voltage;
a second pin configured to receive a second power supply voltage;
a third pin configured to drive a control pin of an external switch coupled between the first pin and the second pin;
a fourth pin configured to drive a switched voltage to a switched-mode power converter; and
a testing circuit configured to detect whether the external switch is coupled to the first, second and third pins, and whether there is a short circuit between the second pin and the fourth pin, and whether there is a short circuit between the second pin and the third pin.

17. The integrated circuit of claim 16, wherein the testing circuit comprises:
a switchable current source coupled to the second pin;
a first comparator coupled to the first pin and the second pin, the first comparator configured to compare a voltage between the first and second pins to a first threshold;
a second comparator coupled to the second pin and the third pin, the second comparator configured to compare a voltage between the second and third pins to a second threshold;
a third comparator coupled to the second pin and the fourth pin, the third comparator configured to compare a voltage between the second and fourth pins to a third threshold; and
a controller coupled to the switchable current source, the first comparator, the second comparator and the third comparator.

18. The integrated circuit of claim 17, wherein the controller is configured to determine whether the external switch is coupled to the first, second and third pins by:
switching on the switchable current source;
applying a turn-on voltage to the third pin; and
determining that the external switch is coupled to the first, second and third pins if the first comparator senses that the voltage between the first pin and the second pin is greater than the first threshold.

19. The integrated circuit of claim 17, wherein the controller is configured to determine whether there is a short circuit between the second pin and the third pin by:
turning on a first switching transistor coupled to the fourth pin;
applying a turn-on voltage to the third pin; and
determining that there is a short circuit between the second pin and the third pin if the second comparator senses that the voltage between the second pin and the third pin is less than the second threshold.

20. The integrated circuit of claim 17, wherein the controller is configured to determine whether there is a short circuit between the second pin and the fourth pin by:
switching on the switchable current source;
applying a turn-on voltage to the third pin; and
determining that there is a short circuit between the second pin and the fourth pin if the third comparator senses that the voltage between the second pin and the fourth pin is less than the third threshold.

21. The integrated circuit of claim 17, wherein the first, second and third thresholds are about 2 volts.

22. The integrated circuit of claim 17, wherein the controller is configured to disable a switched-mode power supply coupled to the second pin and the fourth pin if the external switch is detected and there is a short circuit between the second pin and the fourth pin, or if the external switch is detected and there is a short circuit between the second pin and the third pin.

23. The integrated circuit of claim 17, wherein the controller is configured to enable a switched-mode power supply coupled to the second pin and the fourth pin if the external switch is not detected.

24. The integrated circuit of claim 16, wherein the second pin is disposed directly adjacent to the third pin, and the third pin is disposed directed adjacent to the fourth pin.

\* \* \* \* \*